(12) United States Patent
Yamaguchi et al.

(10) Patent No.: US 10,535,625 B2
(45) Date of Patent: Jan. 14, 2020

(54) SEMICONDUCTOR DEVICE WITH FIRST AND SECOND TRANSISTORS AND SUPPORT PART

(71) Applicant: ROHM CO., LTD., Kyoto-shi, Kyoto (JP)

(72) Inventors: Atsushi Yamaguchi, Kyoto (JP); Junichi Kashiwagi, Kyoto (JP); Hirokatsu Umegami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/044,043

(22) Filed: Jul. 24, 2018

(65) Prior Publication Data

US 2019/0043825 A1    Feb. 7, 2019

(30) Foreign Application Priority Data

Aug. 2, 2017  (JP) .................. 2017-150076

(51) Int. Cl.
*H01L 23/00* (2006.01)
*H01L 23/495* (2006.01)
(Continued)

(52) U.S. Cl.
CPC .......... *H01L 24/49* (2013.01); *H01L 23/3121* (2013.01); *H01L 23/49558* (2013.01);
(Continued)

(58) Field of Classification Search
CPC ......... H01L 24/49; H01L 24/06; H01L 24/48; H01L 23/49562; H01L 29/2003; H01L 23/49558; H01L 23/3121; H01L 25/074; H01L 25/072; H01L 29/205; H01L 23/49575; H01L 24/32; H01L 24/73; H01L 23/3107; H01L 23/49513; H01L 29/7787;
(Continued)

(56) References Cited

U.S. PATENT DOCUMENTS 8,484,342 B2 * 7/2013 Moran ............... G06F 9/466
709/223
8,847,408 B2 * 9/2014 Lin ............... H01L 23/49562
257/777
(Continued)

FOREIGN PATENT DOCUMENTS

JP      2013-45979 A       3/2013
JP      2013045979 A  *    4/2013    ........... H01L 25/04

*Primary Examiner* — Alexander O Williams
(74) *Attorney, Agent, or Firm* — Hamre, Schumann, Mueller & Larson, P.C.

(57) ABSTRACT

According to a first aspect of the present disclosure, a semiconductor device is provided. The semiconductor device includes a first transistor, a second transistor, at least one source terminal, at least one gate terminal, at least one drain terminal, a source wire, a gate wire, a drain wire and a support part. The support part includes two first support-part edges and two second support-part edges. Each of the two first support-part edges is parallel to a first direction, and the two first support-part edges are spaced apart from each other in a second direction that is perpendicular to the first direction. Each of the two second support-part edges is physically connected to the two first support-part edges. The source wire, the gate wire and the drain wire cross at least one of the two second support-part edges in plan view.

20 Claims, 19 Drawing Sheets

(51) Int. Cl.
*H01L 29/20* (2006.01)
*H01L 23/31* (2006.01)
*H01L 25/07* (2006.01)
*H01L 29/205* (2006.01)
*H01L 29/778* (2006.01)

(52) U.S. Cl.
CPC .. *H01L 23/49562* (2013.01); *H01L 23/49575* (2013.01); *H01L 24/06* (2013.01); *H01L 24/48* (2013.01); *H01L 25/072* (2013.01); *H01L 25/074* (2013.01); *H01L 29/2003* (2013.01); *H01L 29/205* (2013.01); H01L 23/3107 (2013.01); H01L 23/49513 (2013.01); H01L 24/32 (2013.01); H01L 24/73 (2013.01); H01L 29/7786 (2013.01); H01L 29/7787 (2013.01); H01L 2224/0401 (2013.01); H01L 2224/05644 (2013.01); H01L 2224/05647 (2013.01); H01L 2224/05655 (2013.01); H01L 2224/0603 (2013.01); H01L 2224/32145 (2013.01); H01L 2224/32245 (2013.01); H01L 2224/33181 (2013.01); H01L 2224/45124 (2013.01); H01L 2224/45144 (2013.01); H01L 2224/45147 (2013.01); H01L 2224/48091 (2013.01); H01L 2224/48106 (2013.01); H01L 2224/48247 (2013.01); H01L 2224/73265 (2013.01); H01L 2924/1033 (2013.01); *H01L 2924/10344* (2013.01); *H01L 2924/1306* (2013.01); *H01L 2924/19043* (2013.01)

(58) Field of Classification Search
CPC ... H01L 29/7786; H01L 23/00; H01L 34/495; H01L 23/31; H01L 29/20; H01L 29/778; H01L 25/07; H01L 2924/19043; H01L 2224/48091; H01L 2224/48106; H01L 2224/48247; H01L 2224/32245; H01L 2224/05644; H01L 2224/05655; H01L 2224/45144; H01L 2224/45224; H01L 2224/0401; H01L 2224/32145; H01L 2224/73265; H01L 2924/1306; H01L 2924/1033; H01L 2924/10344; H01L 2224/0603
USPC ........................................... 257/676
See application file for complete search history.

(56) References Cited

U.S. PATENT DOCUMENTS

| | | | |
|---|---|---|---|
| 10,163,811 B2 * | 12/2018 | Zhao | H01L 23/552 |
| 2016/0005725 A1 * | 1/2016 | Ikeda | H01L 25/18 257/76 |
| 2017/0317014 A1 * | 11/2017 | Tsai | H01L 23/49558 |
| 2017/0317015 A1 * | 11/2017 | Lee | H01L 23/3107 |

* cited by examiner

SEMICONDUCTOR DEVICE WITH FIRST AND SECOND TRANSISTORS AND SUPPORT PART

FIELD

The present disclosure relates to a semiconductor device.

BACKGROUND

A technique related to the present disclosure is described in JP-A-2013-45979, for example.

SUMMARY

According to a first aspect of the present disclosure, a semiconductor device is provided. The semiconductor device includes a first transistor, a second transistor, at least one source terminal, at least one gate terminal, at least one drain terminal, a source wire, a gate wire, a drain wire and a support part. The support part includes two first support-part edges and two second support-part edges. Each of the two first support-part edges is parallel to a first direction, and the two first support-part edges are spaced apart from each other in a second direction that is perpendicular to the first direction. Each of the two second support-part edges is physically connected to the two first support-part edges. The source wire, the gate wire and the drain wire cross at least one of the two second support-part edges in plan view.

DRAWINGS

Figure 1:
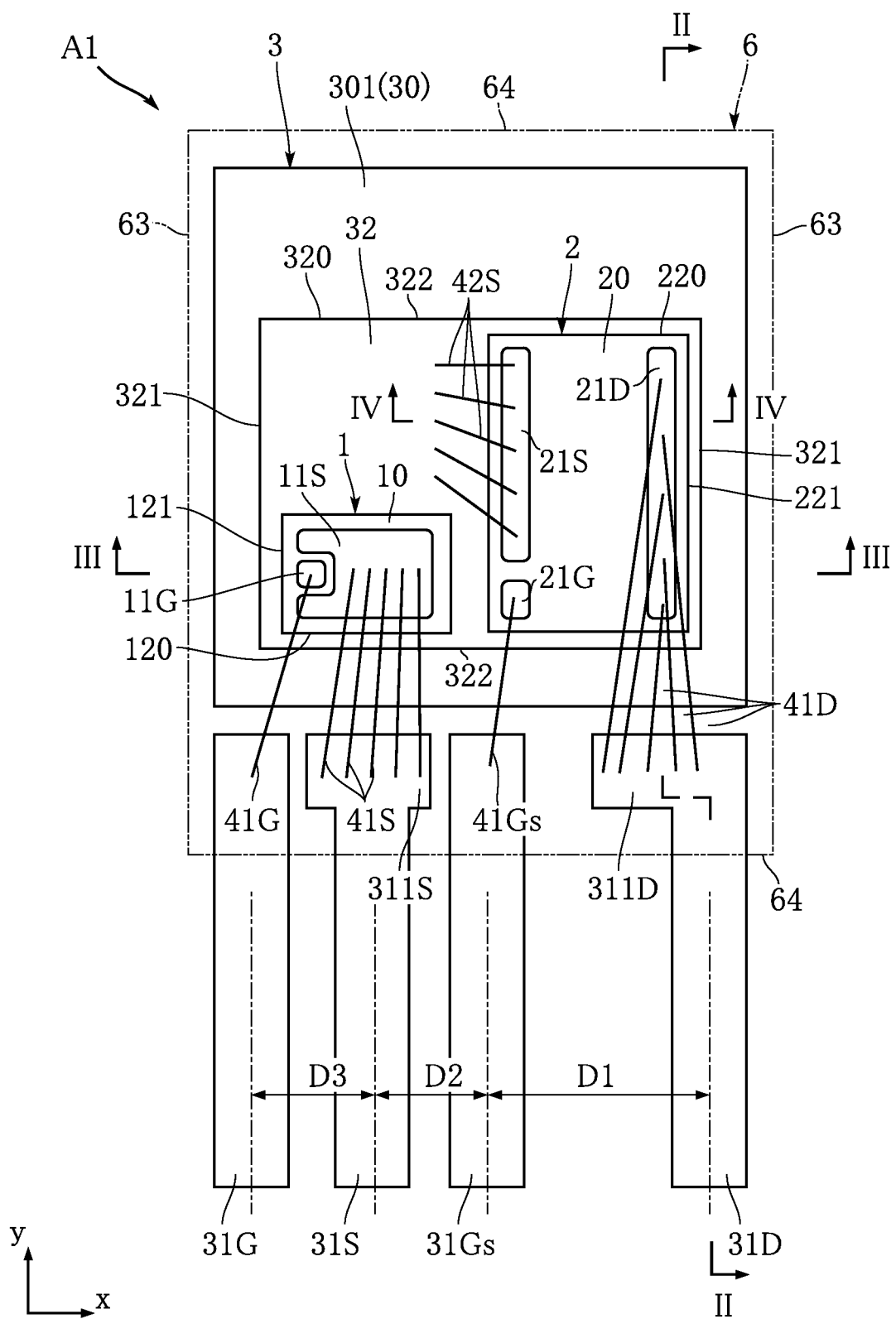
Figure 2:
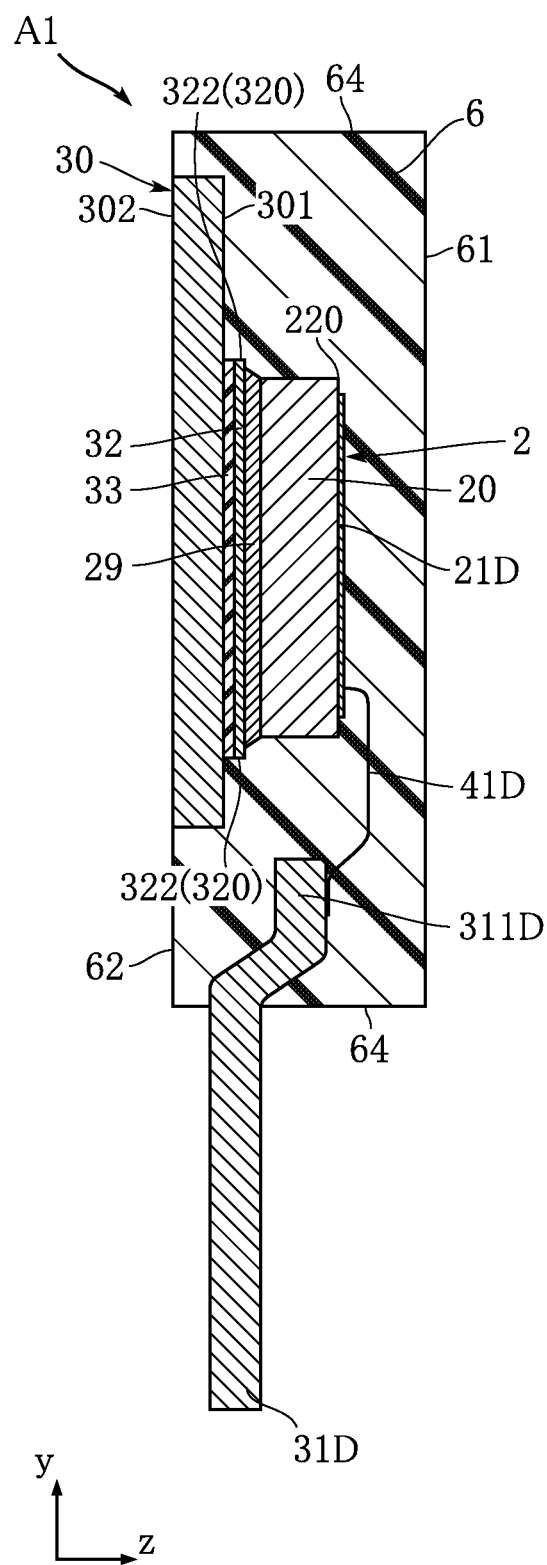
Figure 3:
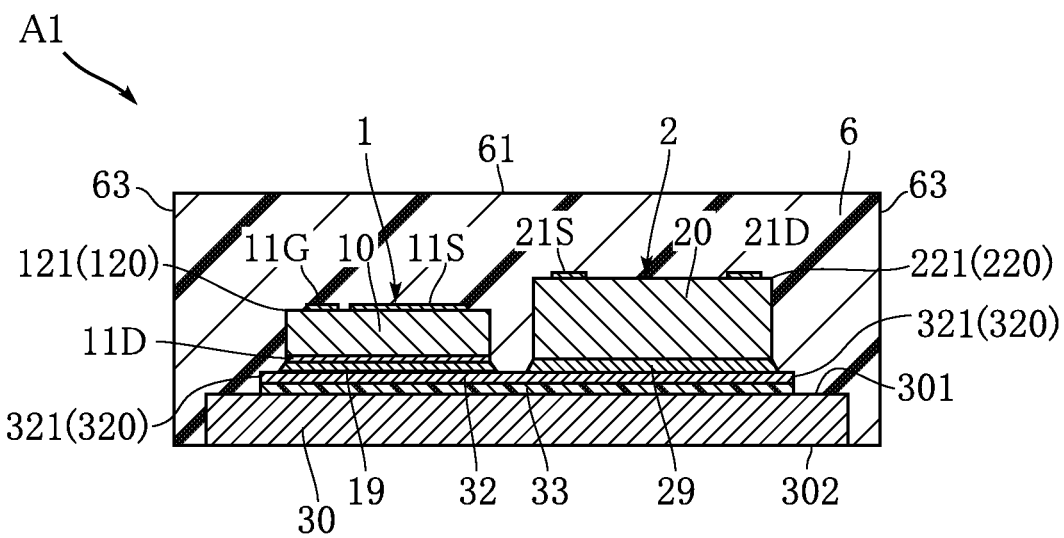
Figure 4:
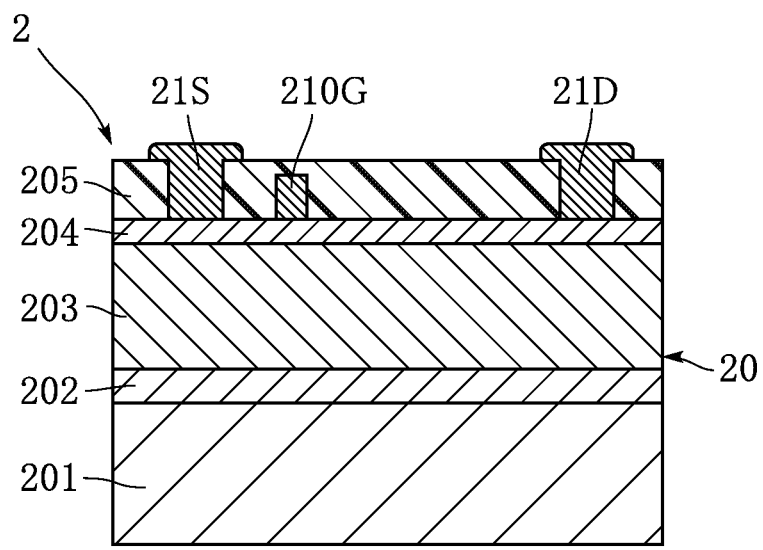
Figure 5:
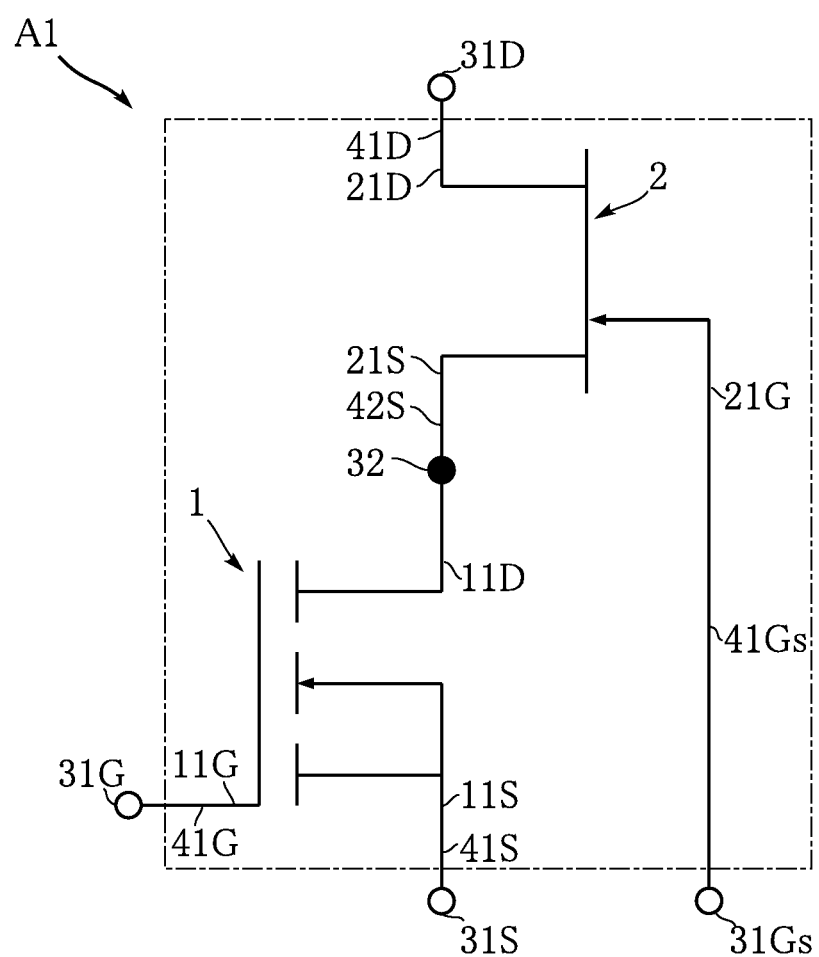
Figure 6:
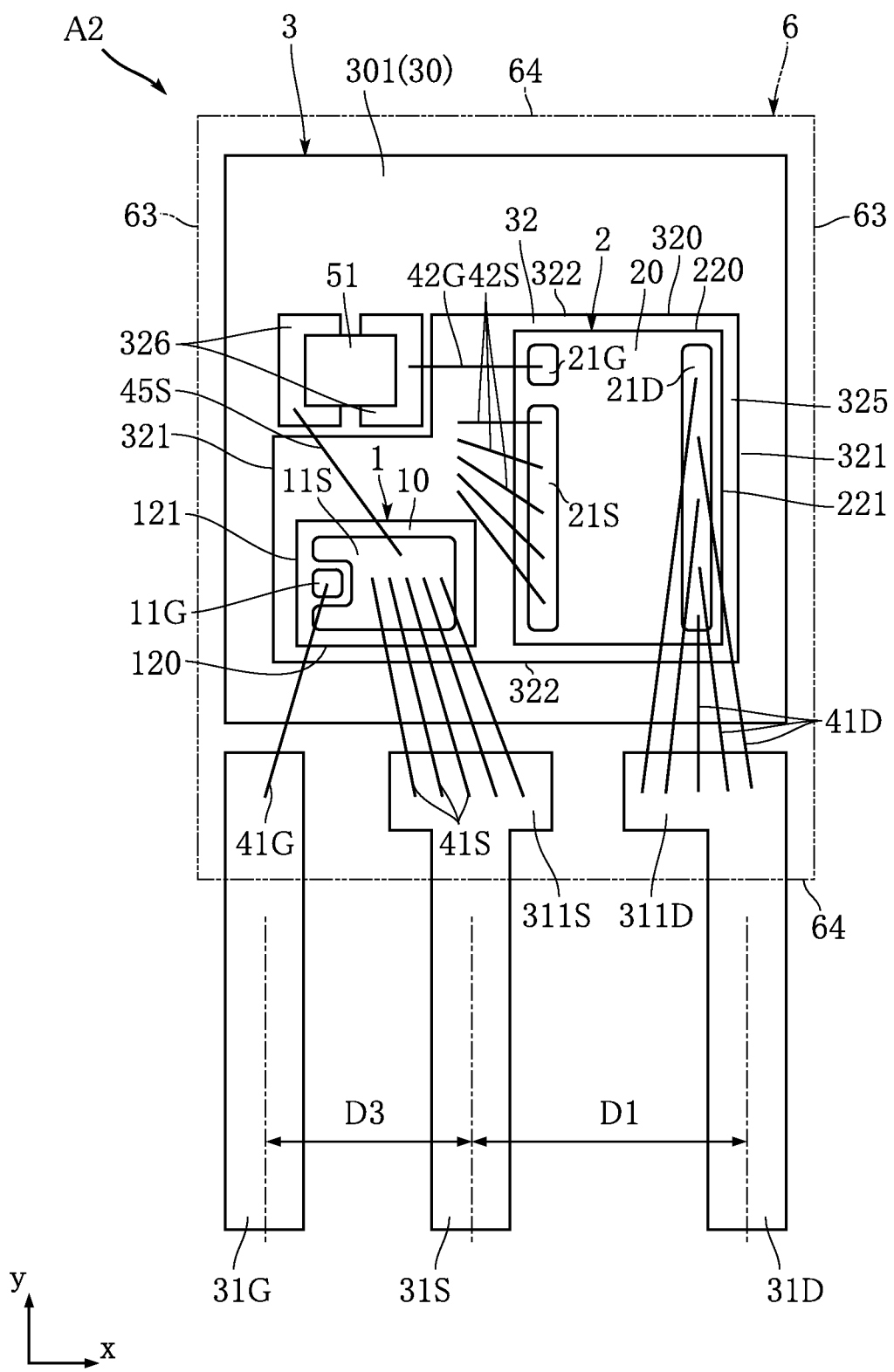
Figure 7:
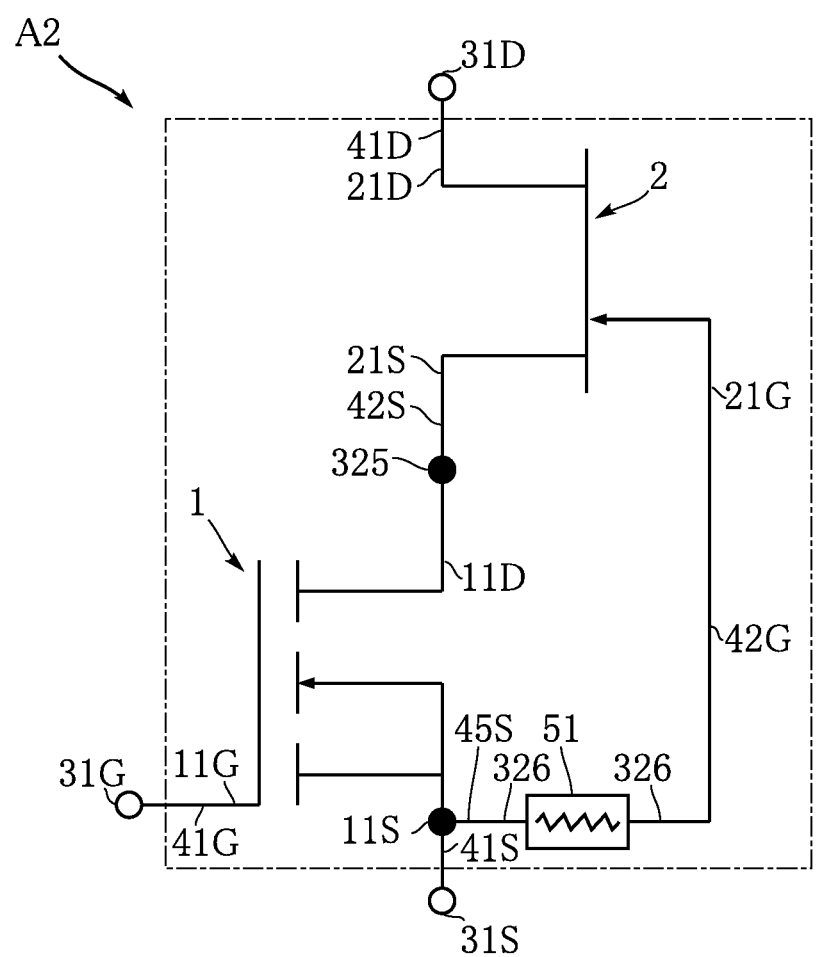
Figure 8:
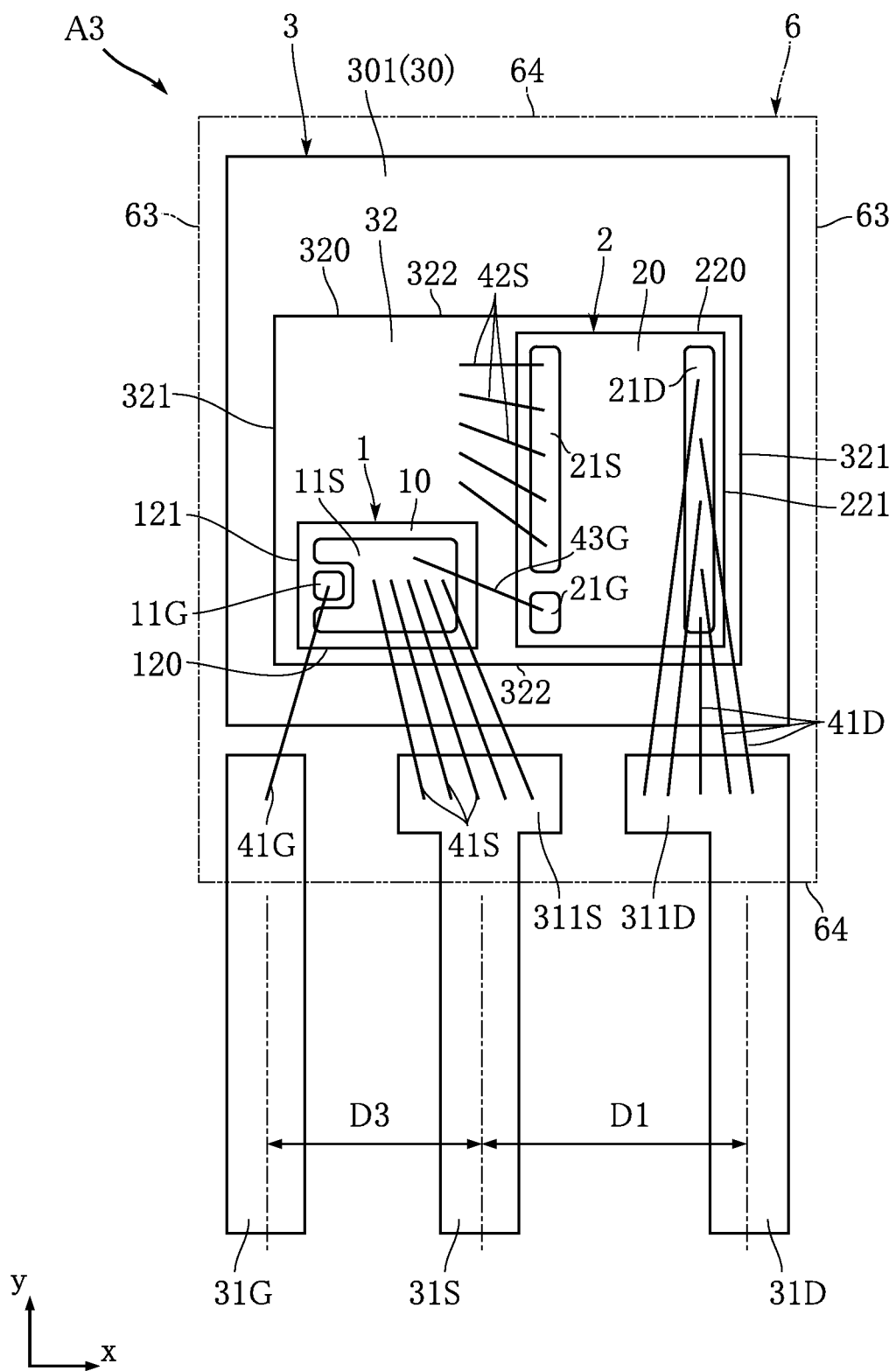
Figure 9:
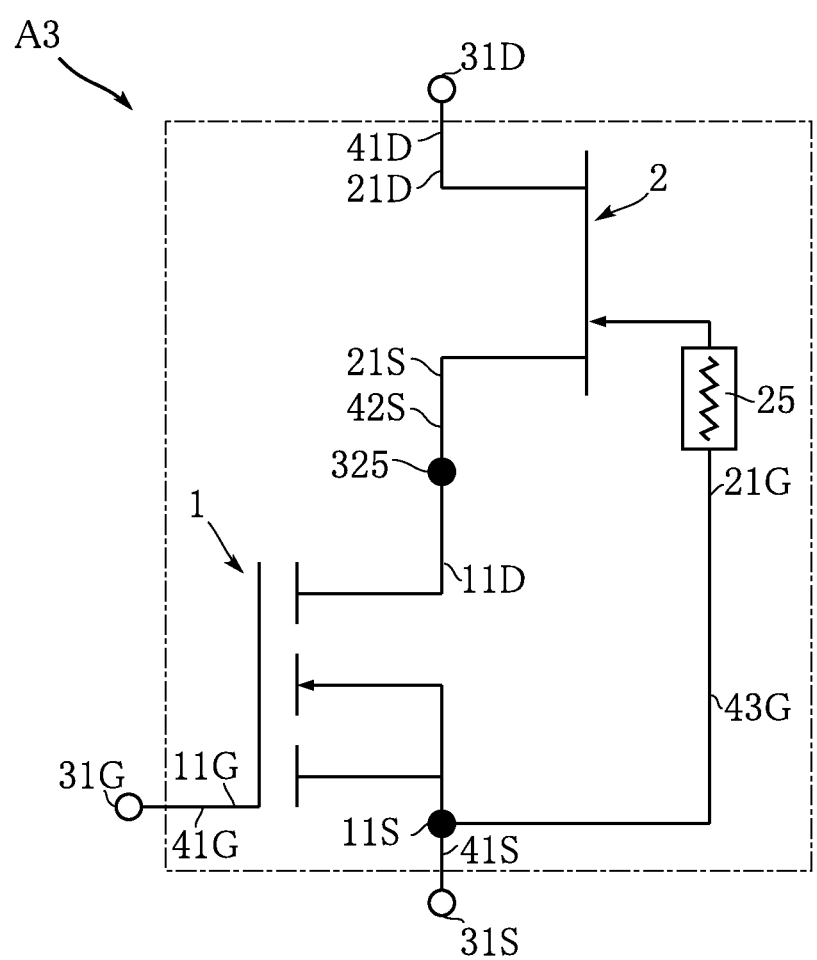
Figure 10:
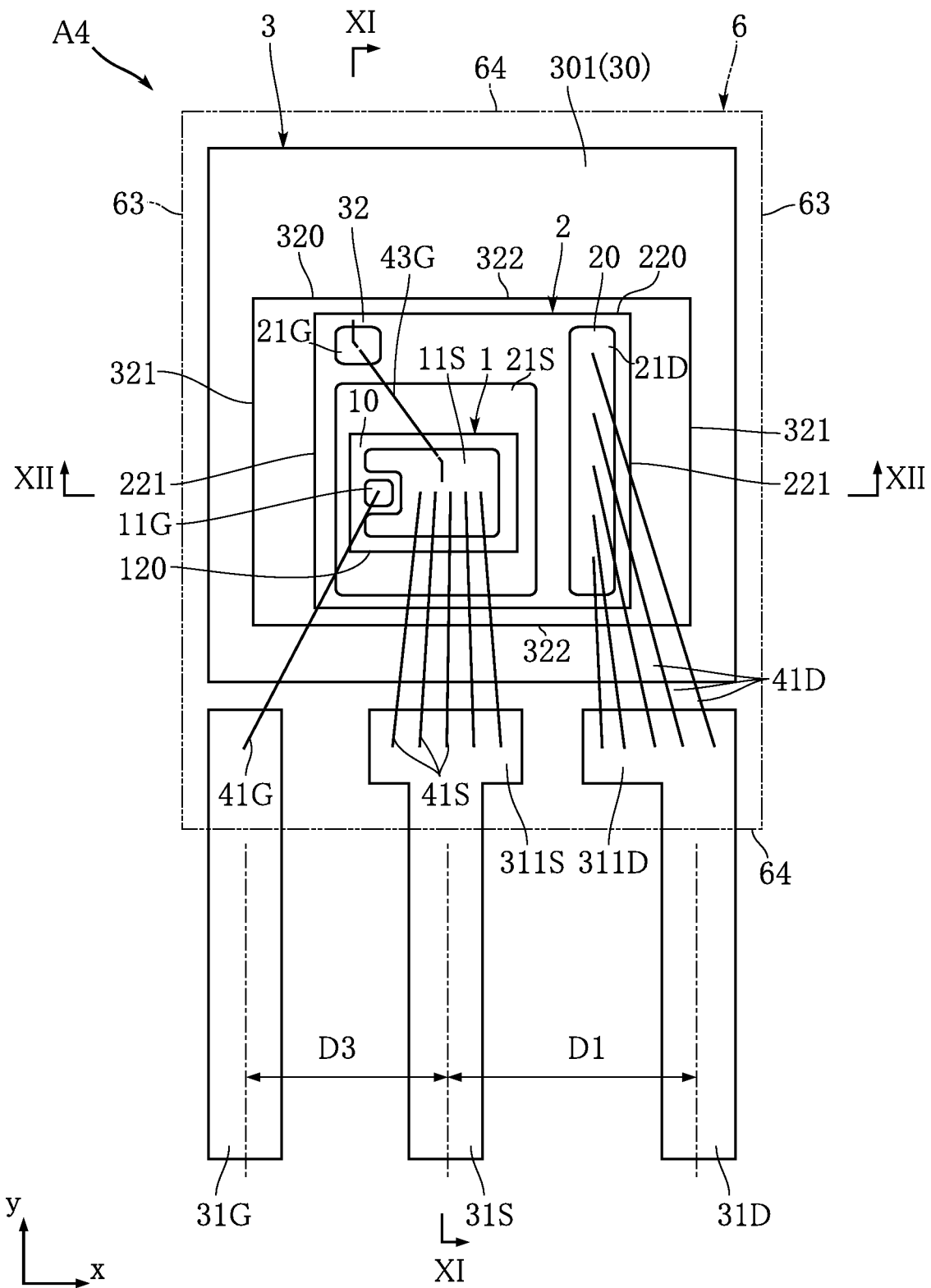
Figure 11:
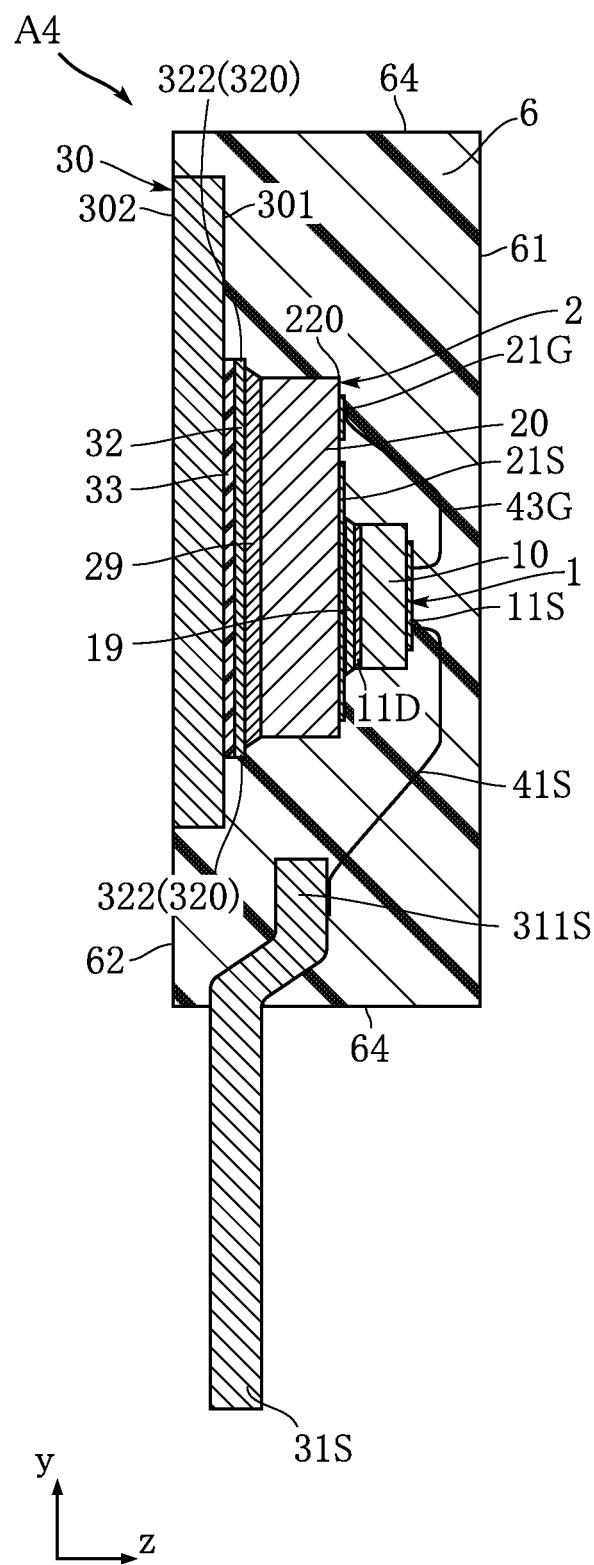
Figure 12:
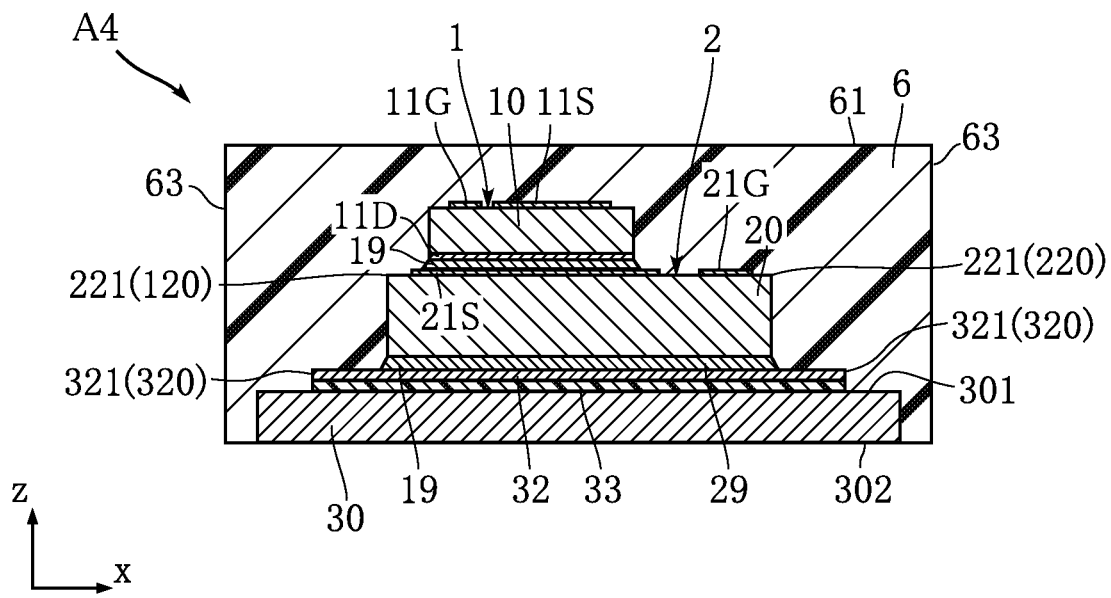
Figure 13:
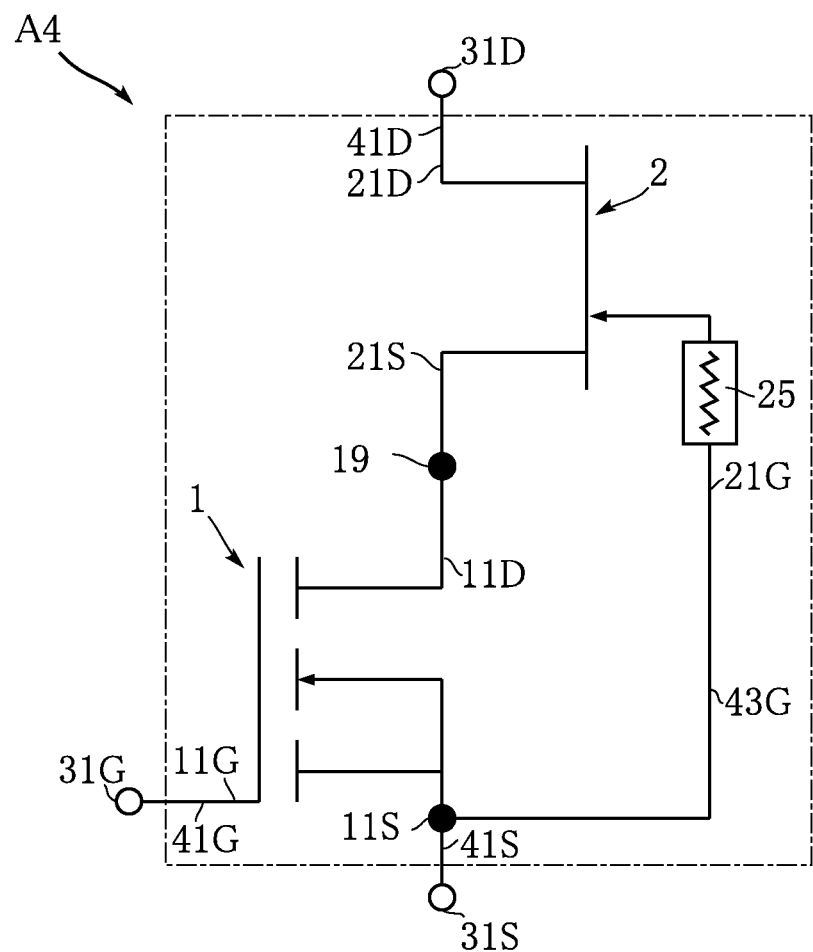
Figure 14:
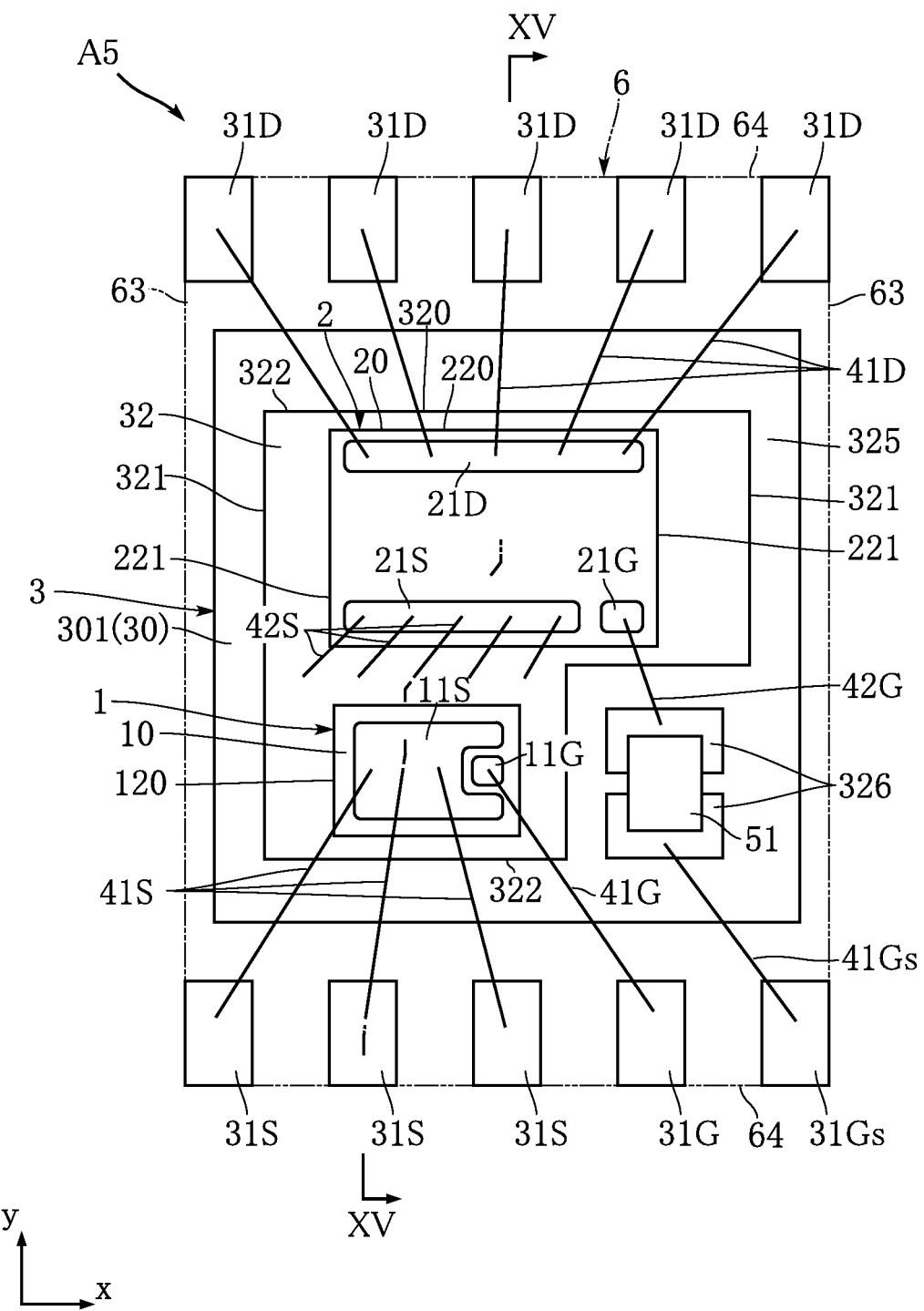
Figure 15:
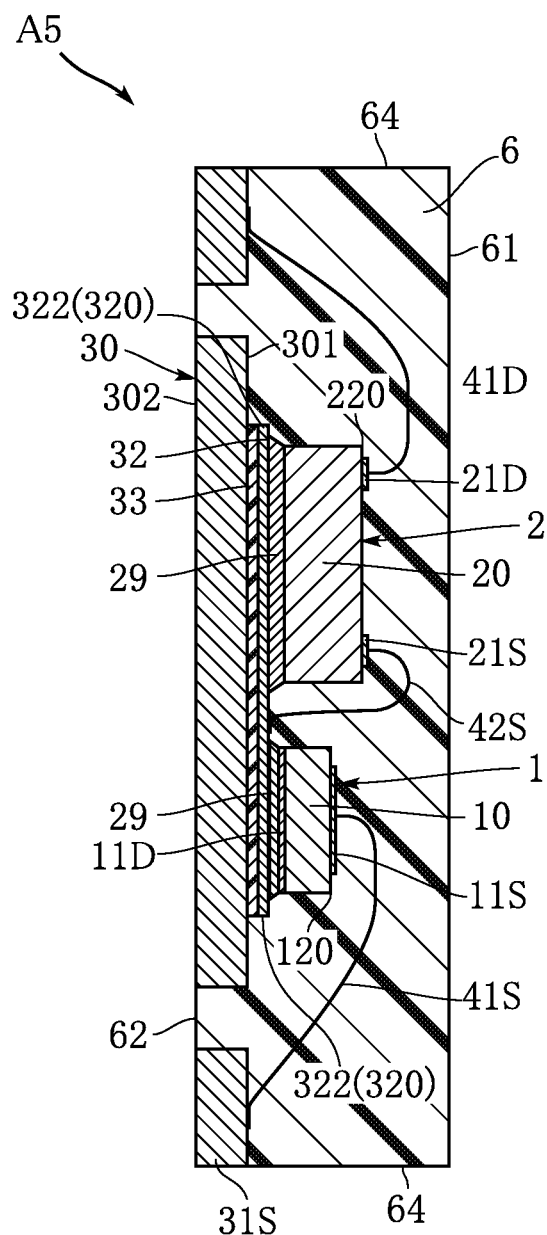
Figure 16:
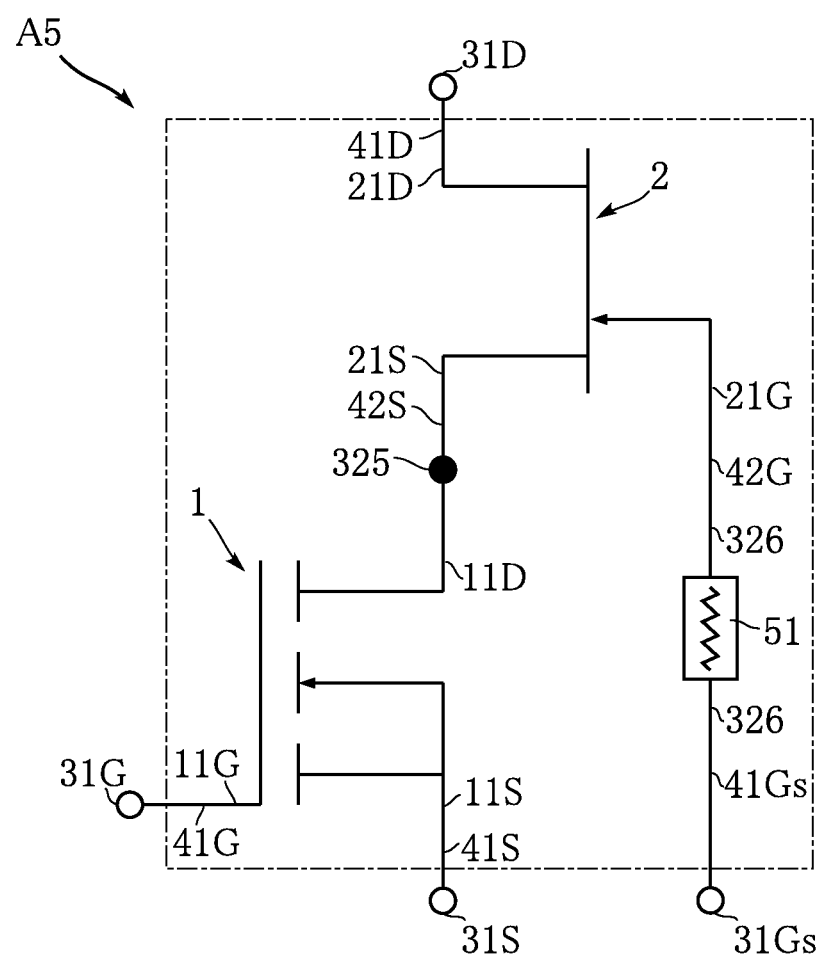
Figure 17:
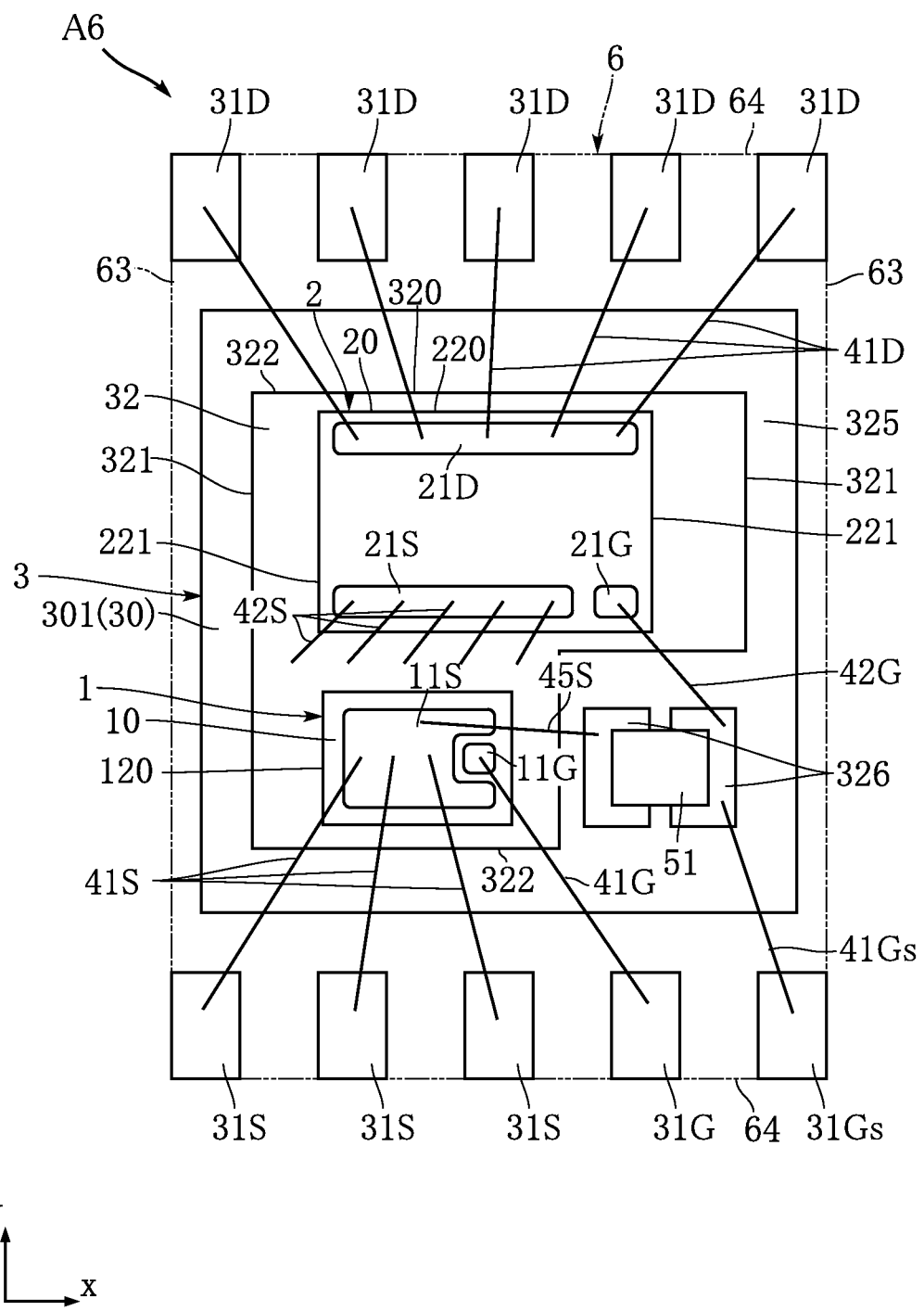
Figure 18:
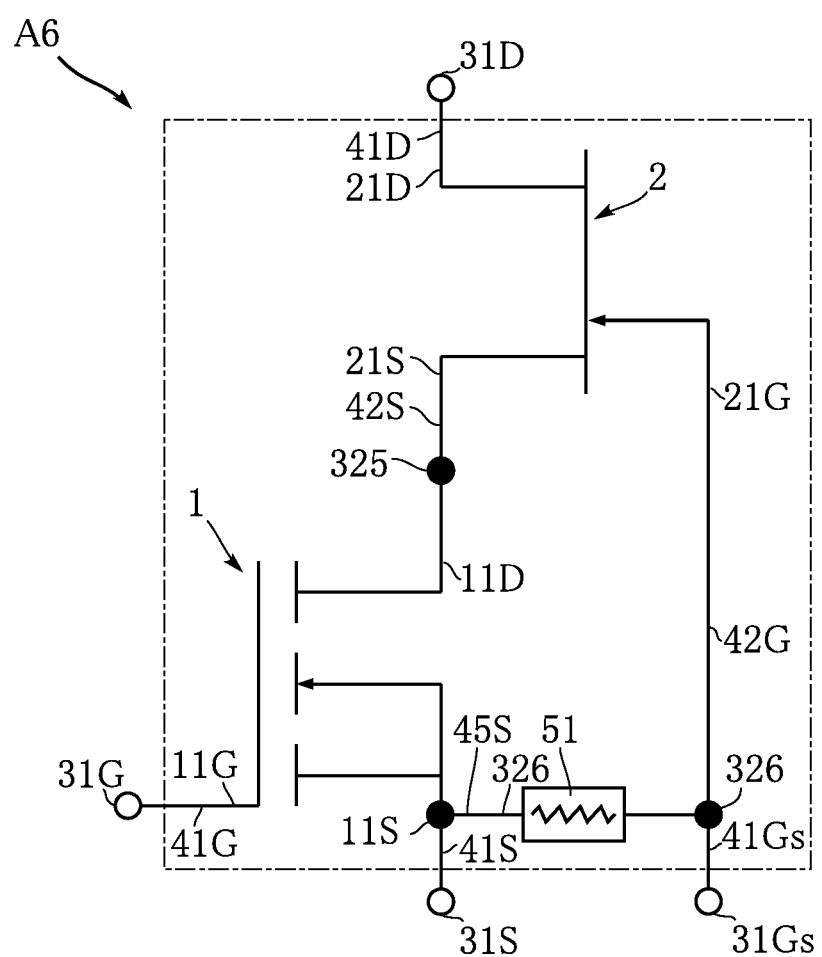
Figure 19:
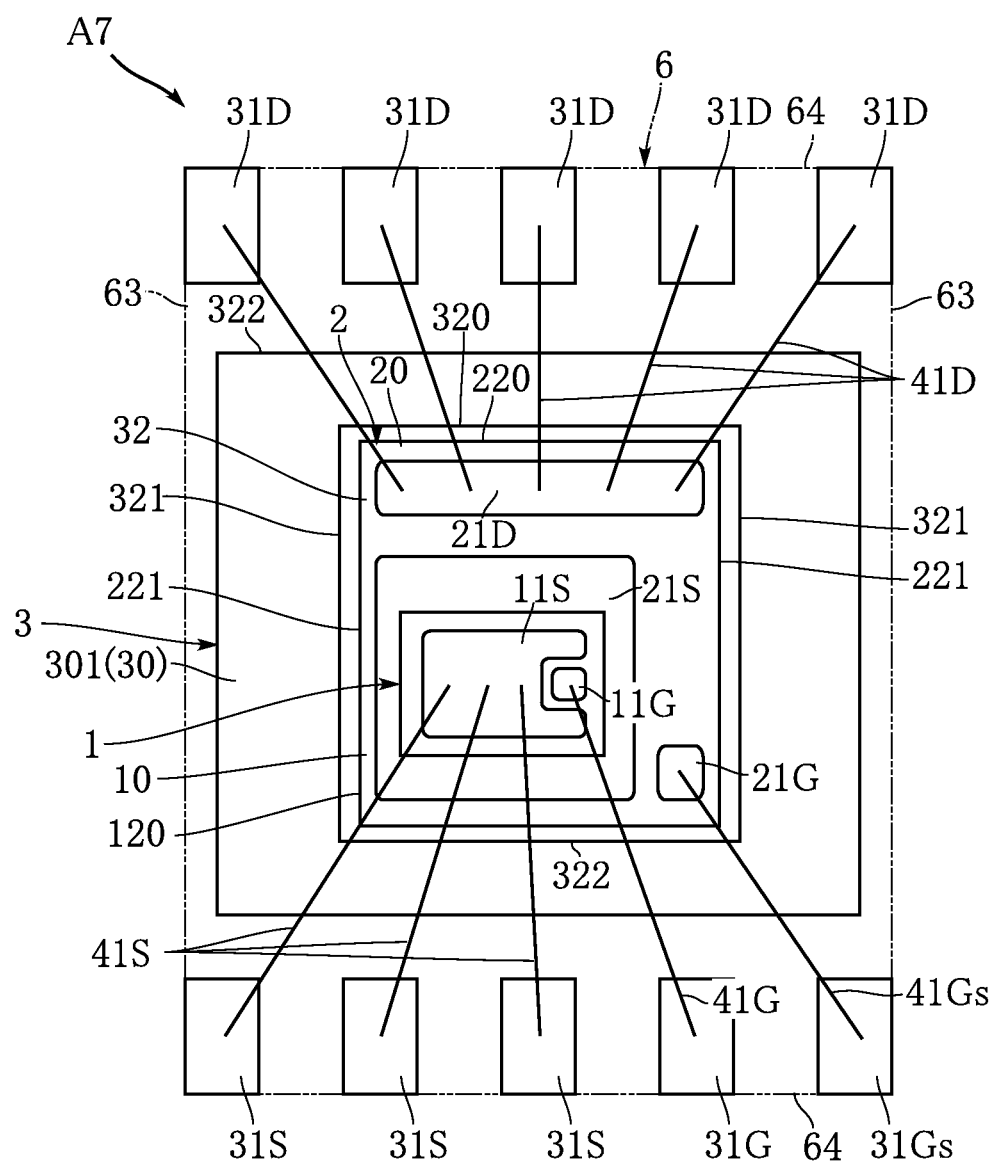
Figure 20:
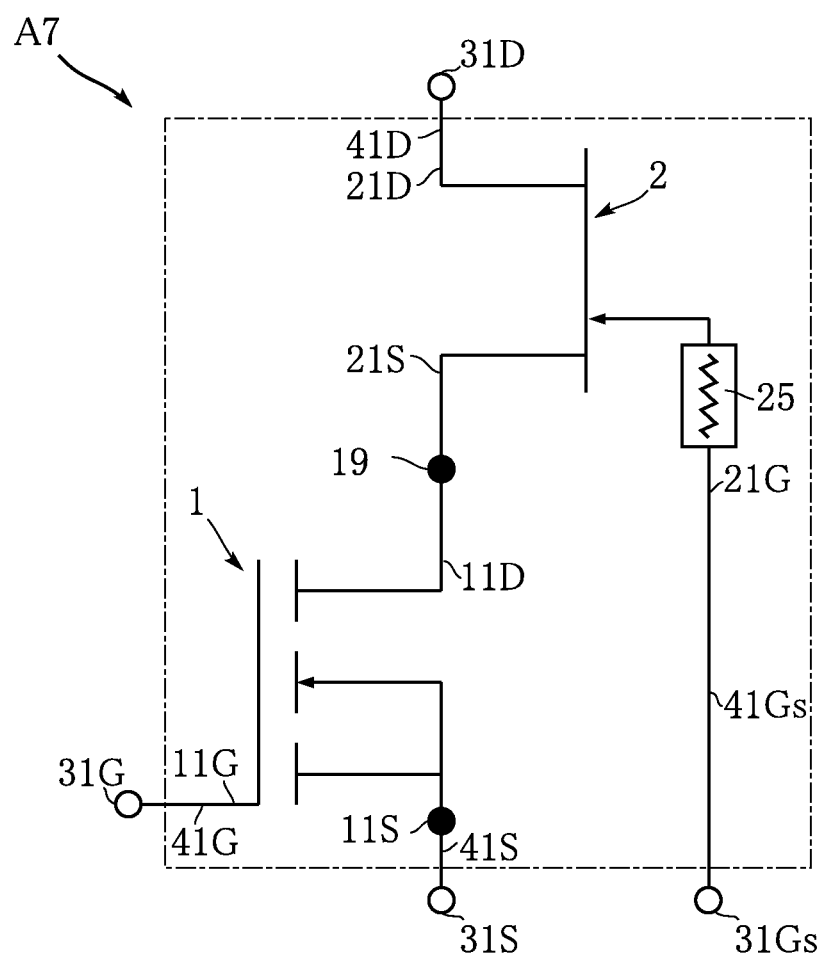
Figure 21:
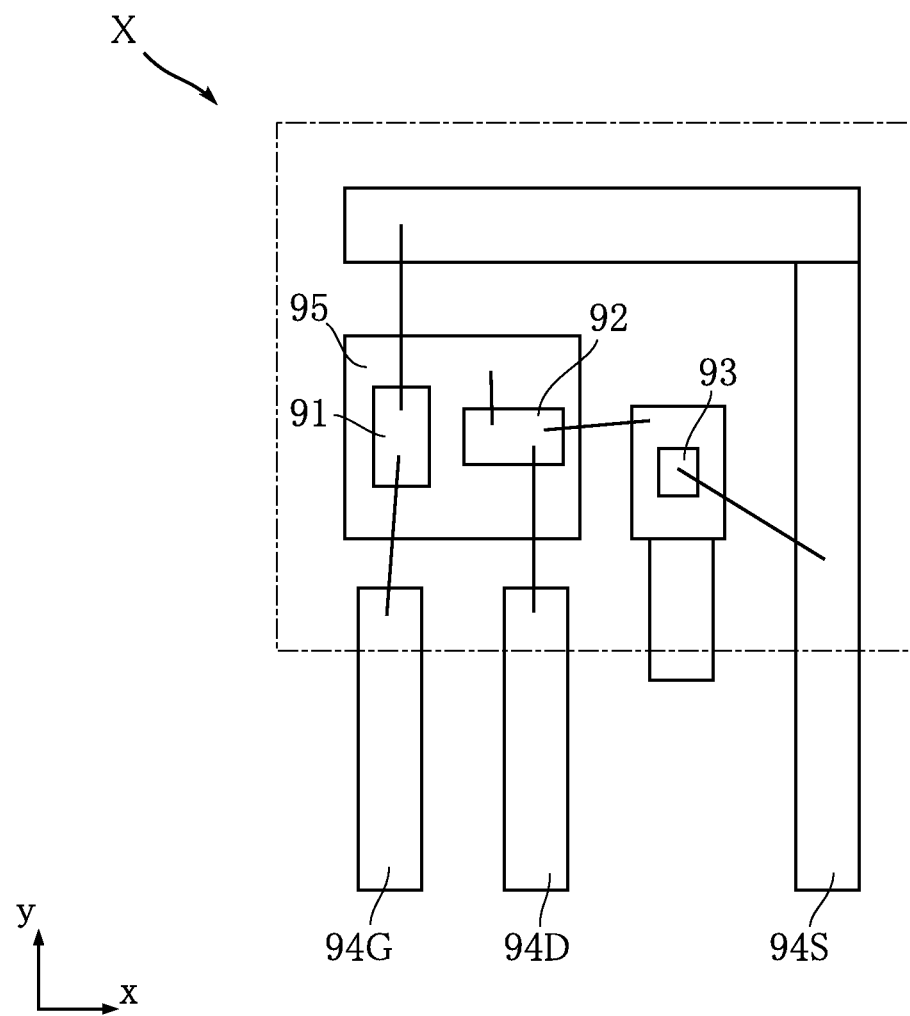

FIG. 1 is a plan view showing a semiconductor device according to a first embodiment of the present disclosure;
FIG. 2 is a sectional view taken along line II-II in FIG. 1;
FIG. 3 is a sectional view taken along line III-III in FIG. 1;
FIG. 4 is a sectional view taken along line IV-IV in FIG. 1;
FIG. 5 is a circuit diagram of the semiconductor device according to the first embodiment of the present disclosure;
FIG. 6 is a plan view showing a semiconductor device according to a second embodiment of the present disclosure;
FIG. 7 is a circuit diagram of the semiconductor device according to the second embodiment of the present disclosure;
FIG. 8 is a plan view showing a semiconductor device according to a third embodiment of the present disclosure;
FIG. 9 is a circuit diagram of the semiconductor device according to the third embodiment of the present disclosure;
FIG. 10 is a plan view showing a semiconductor device according to a fourth embodiment of the present disclosure;
FIG. 11 is a sectional view taken along line XI-XI in FIG. 10;
FIG. 12 is a sectional view taken along line XII-XII in FIG. 10;
FIG. 13 is a circuit diagram of a semiconductor device according to a fourth embodiment of the present disclosure;
FIG. 14 is a plan view showing a semiconductor device according to a fifth embodiment of the present disclosure;
FIG. 15 is a sectional view taken along line XV-XV in FIG. 14;
FIG. 16 is a circuit diagram of the semiconductor device according to the fifth embodiment of the present disclosure;
FIG. 17 is a plan view showing a semiconductor device according to a sixth embodiment of the present disclosure;
FIG. 18 is a circuit diagram of the semiconductor device according to the sixth embodiment of the present disclosure;
FIG. 19 is a plan view showing a semiconductor device according to a seventh embodiment of the present disclosure;
FIG. 20 is a circuit diagram of the semiconductor device according to the seventh embodiment of the present disclosure; and
FIG. 21 is a plan view of a semiconductor device of a comparative example.

EMBODIMENTS

Embodiments of the present disclosure are described below with reference to the drawings.

First Embodiment

FIGS. 1-5 show a semiconductor device according to a first embodiment of the present disclosure. The semiconductor device A1 according to the present embodiment includes a first transistor 1, a second transistor 2, a lead frame 3, a plurality of source wires 41S, a gate wire 41G, a plurality of drain wires 41D, a wire 41Gs, a plurality of wires 42S and a sealing resin 6.

FIG. 1 is a plan view of the semiconductor device A1. FIG. 2 is a sectional view taken along line II-II in FIG. 1. FIG. 3 is a sectional view taken along line in FIG. 1. FIG. 4 is a sectional view taken along line IV-IV in FIG. 1. FIG. 5 is a circuit diagram of the semiconductor device A1. Note that, in FIGS. 1-4, the x direction corresponds to an example of the second direction, and the y direction corresponds to an example of the first direction. A direction that is perpendicular to both of the x direction and the y direction corresponds to an example of the third direction. A view in z direction corresponds to an example of the plan view. For ease of understanding, the sealing resin 6 is indicated by a phantom line in FIG. 1, which holds true for the plan views for other embodiments.

The first transistor 1 is, for example, a normally-off transistor. A normally-off transistor is a transistor in which when no gate voltage is applied a channel does not exist and thus a drain current does not flow. The first transistor 1 includes an element body 10, a first source electrode 11S, a first drain electrode 11D and a first gate electrode 11G. The element body 10 forms a major part of the first transistor 1 and is made of Si, for example. The element body 10 is doped with additive elements and includes an n part and a p part that are arranged appropriately. The first source electrode 11S and the first gate electrode 11G are formed on the upper surface (obverse surface) of the element body 10. The first drain electrode 11D is formed on the lower surface (reverse surface) of the element body 10.

The first source electrode 11S, the first drain electrode 11D and the first gate electrode 11G are made of metal and formed by plating, for example. For proper wire bonding or solder bonding, it is preferable that the surface layers of the first source electrode 11S, the first drain electrode 11D and the first gate electrode 11G are made of Au. The portions of the first source electrode 11S, the first drain electrode 11D and the first gate electrode 11G that are covered with the surface layers may be made of metal such as Cu or Ni, for example.

In the present embodiment, as viewed in the z direction, the first source electrode 11S is larger than the first gate electrode 11G. The first source electrode 11S has a recess to be generally C-shaped in plan view. The first gate electrode 11G is located in the recess of the first source electrode 11S. The first drain electrode 11D covers the almost entire reverse surface of the element body 10.

For example, the second transistor 2 is a normally-on transistor. A normally-on transistor is a transistor in which even when no gate voltage is applied a channel exists such that a drain current can flow. In a normally-on transistor, the current can stop when a reverse voltage (pinch-off voltage) is applied. The second transistor 2 includes an element body 20, a second source electrode 21S, a second drain electrode 21D and a second gate electrode 21G. The second transistor 2 of the present embodiment has a structure shown in FIG. 4. That is, the element body 20 includes a Si layer 201, a buffer layer 202, a GaN layer 203 and an AlGaN layer 204 formed one on top of another. In the present embodiment, as shown in FIG. 1, the dimension of the second transistor 2 in plan view is larger than the dimension of the first transistor 1 in plan view. As shown in FIG. 3, the thickness of the second transistor 2 in the z direction is larger than that of the first transistor 1.

With reference to FIG. 4, the Si layer 201 may be formed by using a Si single crystal substrate. The buffer layer 202 may include an AlN layer and an AlGaN layer formed one on top of another. The GaN layer 203 may be an undoped GaN layer with no impurities intentionally added. Alternatively, the GaN layer 203 may contain predetermined impurities that are intentionally added. The AlGaN layer 204 may be an undoped AlGaN layer with no impurities intentionally added. Alternatively, the AlGaN layer 204 may contain predetermined impurities that are intentionally added. In the present embodiment, the buffer layer 202, the GaN layer 203 and the AlGaN layer 204 contain a Group III nitride semiconductor.

The second source electrode 21S, the second drain electrode 21D and the second gate electrode 21G are electrically connected to the AlGaN layer 204. The AlGaN layer 204 is covered with an insulating layer 205 except for the portions necessary for electrical connection with the second source electrode 21S, the second drain electrode 21D, or the second gate electrode 21G. The second gate wiring portion 210G is a portion of a wiring that extends from the point shown in FIG. 4 to the second gate electrode 21G and covered with the insulating layer 205.

As shown in FIG. 1, in the present embodiment, the second source electrode 21S, the second drain electrode 21D and the second gate electrode 21G are formed on the upper surface (obverse surface) of the element body 20. In the illustrated example, each of the second source electrode 21S and the second drain electrode 21D has an elongated shape having a length in the y direction, and the second gate electrode 21G has a rectangular shape smaller than the second source electrode 21S and the second drain electrode 21D. The second source electrode 21S and the second gate electrode 21G are spaced apart from the second drain electrode 21D in the x direction. The second source electrode 21S and the second gate electrode 21G are aligned in the y direction.

The second source electrode 21S, the second drain electrode 21D and the second gate electrode 21G are made of metal and formed by plating, for example. For proper wire bonding or solder bonding, it is preferable that the surface layers of the second source electrode 21S, the second drain electrode 21D and the second gate electrode 21G are made of Au. The portions of the second source electrode 21S, the second drain electrode 21D and the second gate electrode 21G that are covered with the surface layers are made of metal such as Cu or Ni, for example.

The lead frame 3 supports the first transistor 1 and the second transistor 2 and constitutes a conduction path between the first and the second transistors 1 and 2 and the outside. In the present embodiment, the lead frame 3 includes an island 30, a source terminal 31S, a drain terminal 31D, agate terminal 31G and a sub-gate terminal 31Gs. For example, the lead frame 3 is formed by punching or bending a plate made of metal such as Cu or Ni.

The island 30 overlaps with both of the first transistor 1 and the second transistor 2 as viewed in the z direction and supports the first transistor 1 and the second transistor 2. The shape and the size of the island 30 are not particularly limited. In the present embodiment, the island 30 is rectangular in plan view and its dimensions as viewed in the z direction are larger than the sum of the dimensions of the first transistor 1 and the second transistor 2 as viewed in the z direction. The island 30 has an obverse surface 301 and a reverse surface 302 facing away from each other in the z direction.

In the present embodiment, the obverse surface 301 of the island 30 is provided with a metal layer 32. The metal layer 32 is made of a metal or an alloy made of Al, Cu and/or Ni, for example. In the illustrated example, the metal layer 32 is fixed to the island 30 via an insulating layer 33. The dimensions of the metal layer 32 as viewed in the z direction are smaller than the dimensions of the island 30 in plan view. The method for forming the metal layer 32 is not particularly limited. For example, the metal layer 32 may be formed on the insulating layer 33 by plating or the like, or the metal layer 32 formed in advance may be bonded to the island 30 by using the insulating layer 33. In the present embodiment, both of the first transistor 1 and the second transistor 2 are bonded to the metal layer 32 via a bonding layer 19 and a bonding layer 29, respectively. The metal layer 32 corresponds to an example of the support part. Note that, in the first transistor 1, the first drain electrode 11D is bonded to the metal layer 32 by using the bonding layer 19. Thus, the bonding layer 19 is electrically conductive. Note that, unlike the present embodiment, at least one of the first transistor 1 and the second transistor 2 may be bonded to the island 30 to be supported on the island 30. In this case, the island 30 corresponds to an example of the support part.

In the present embodiment, as shown in FIG. 1, the first transistor 1 and the second transistor 2 are spaced apart from each other in the x direction. In the illustrated example, the respective lower edges in the y direction in FIG. 1 of the first transistor 1 and the second transistor 2 are generally aligned.

The metal layer 32 has an edge 320. The edge 320 may be an edge around the whole metal layer 32 as viewed in the z direction. In the present embodiment, the edge 320 includes a pair of first support-part edges 321 and a pair of second support-part edges 322. Each of the paired first support-part edges 321 is parallel to the y direction. The paired first support-part edges 321 are spaced apart from each other in the x direction. Each of the paired second support-part edges 322 connects two corresponding ends of the paired first support-part edges 321. In the present embodiment, the metal layer 32 is rectangular as viewed in the z direction. Thus, each of the paired second support-part edges 322 is parallel to the x direction.

The first transistor 1 has an edge 120, and the second transistor 2 has an edge 220. The edge 120 may be an edge around the whole first transistor 1 as viewed in the z direction. In the present embodiment, the edge 120 includes a first element edge part 121, and the edge 220 includes a first element edge part 221. The first element edge part 121 and the first element edge part 221 are a pair of edge parts that are parallel to the y direction and spaced apart from each other by the largest distance in the x direction among parts of the edges 120 and 220. In other words, parts of the edges 120 and 220 other than the first element edge parts 121 and 221 are located between the first element edge part 121 and the first element edge part 221 in the x direction.

The source terminal 31S and the drain terminal 31D are terminals through which main current is inputted or outputted. The gate terminal 31G is a terminal through which a control voltage for the semiconductor device A1 is applied. The sub-gate terminal 31Gs is used for auxiliary control of the semiconductor device A1, and a resistor element for adjusting the characteristics of the semiconductor device A1 (e.g., the characteristics of the second transistor 2) may be connected to this terminal 31Gs.

Each of the source terminal 31S, the drain terminal 31D, the gate terminal 31G and the sub-gate terminal 31Gs is in the form of a bar or a strip extending in the y direction. As shown in FIG. 2, the source terminal 31S, the drain terminal 31D, the gate terminal 31G and the sub-gate terminal 31Gs may be bent appropriately. The source terminal 31S, the drain terminal 31D, the gate terminal 31G and the sub-gate terminal 31Gs are located on one side of the metal layer 32 in the y direction.

In the present embodiment, as shown in FIG. 1, the gate terminal 31G, the source terminal 31S, the sub-gate terminal 31Gs and the drain terminal 31D are arranged in the mentioned order in the x direction. The distance D1 between the center of the drain terminal 31D and the center of the sub-gate terminal 31Gs is larger than the distance D2 between the center of the sub-gate terminal 31Gs and the center of the source terminal 31S and the distance D3 between the center of the source terminal 31S and the center of the gate terminal 31G. The distance D2 and the distance D3 are generally equal.

In the present embodiment, the source terminal 31S has a wide portion 311S, and the drain terminal 31D has a wide portion 311D. The wide portion 311S is an end of the source terminal 31S which is located closer to the metal layer 32 and of which dimension in the x direction is larger than other portions. The wide portion 311D is an end of the drain terminal 31D which is located closer to the metal layer 32 and of which dimension in the x direction is larger than other portions.

The plurality of source wires 41S, the gate wire 41G, the plurality of drain wires 41D, the wire 41Gs and the plurality of wires 42S constitute conduction paths for allowing the first transistor 1 and the second transistor 2 to function properly. The plurality of source wires 41S, the gate wire 41G, the plurality of drain wires 41D, the wire 41Gs and the plurality of wires 42S are made of metal such as Au, Al or Cu. An instance in which the plurality of source wires 41S, the gate wire 41G, the plurality of drain wires 41D, the wire 41Gs and the plurality of wires 42S are made of Au is described below. Note that the number of each type of wires may vary depending on the material used for the wires.

Each of the plurality of source wires 41S has a first end connected to the first source electrode 11S of the first transistor 1 and a second end connected to the wide portion 311S of the source terminal 31S. In the present embodiment, the respective first ends of the plurality of source wires 41S are connected to the first source electrode 11S as aligned in the x direction. The respective second ends of the plurality of source wires 41S are connected to the wide portion 311S as aligned in the x direction.

The gate wire 41G has a first end connected to the first gate electrode 11G of the first transistor 1 and a second end connected to the gate terminal 31G.

Each of the plurality of drain wires 41D has a first end connected to the second drain electrode 21D of the second transistor 2 and a second end connected to the wide portion 311D of the drain terminal 31D. In the present embodiment, the respective first ends of the plurality of drain wires 41D are connected to the second drain electrode 21D as aligned in the y direction. The respective second ends of the plurality of drain wires 41D are connected to the wide portion 311D as aligned in the x direction.

The wire 41Gs has a first end connected to the second gate electrode 21G of the second transistor 2 and a second end connected to the sub-gate terminal 31Gs.

Each of the plurality of wires 42S has a first end connected to the second source electrode 21S of the second transistor 2 and a second end connected to the metal layer 32. With this arrangement, the first drain electrode 11D of the first transistor 1 and the second source electrode 21S of the second transistor 2 are electrically connected to each other via the bonding layer 19, the metal layer 32 and the plurality of wires 42S.

As shown in FIG. 1, all of the plurality of source wires 41S, the gate wire 41G and the plurality of drain wires 41D cross one of the second support-part edges 322 of the metal layer 32. Also, all of the plurality of source wires 41S, the gate wire 41G and the plurality of drain wires 41D cross the edge 120 or the edge 220 between the first element edge part 121 and the first element edge part 221 in the x direction.

FIG. 5 is a circuit diagram of the semiconductor device A1. The first transistor 1, the second transistor 2, the island 30, the source terminal 31S, the drain terminal 31D, the gate terminal 31G, the plurality of source wires 41S, the gate wire 41G, the plurality of drain wires 41D, the wire 41Gs and the wires 42S described above form the circuit shown in FIG. 5 in the semiconductor device A1. That is, in the semiconductor device A1, the first transistor 1 that is normally off and the second transistor 2 that is normally on are cascode-connected.

The sealing resin 6 protects the first transistor 1, the second transistor 2, part of the lead frame 3, the plurality of source wires 41S, the gate wire 41G, the plurality of drain wires 41D, the wire 41Gs and the wires 42S and is made of an insulating resin such as epoxy resin, for example. The sealing resin 6 has an obverse surface 61, a reverse surface 62, a pair of side surfaces 63 and a pair of end surfaces 64.

The obverse surface 61 faces the same side as the obverse surface 301 of the island 30. The reverse surface 62 faces the same side as the reverse surface 302 of the island 30. All of the first transistor 1, the second transistor 2, part of the lead frame 3, the plurality of source wires 41S, the gate wire 41G, the plurality of drain wires 41D, the wire 41Gs and the wires 42S are located on the inner side of the obverse surface 61 in the z direction. In the present embodiment, the reverse surface 302 of the island 30 is exposed from the reverse surface 62 of the sealing resin 6.

The paired side surfaces 63 face away from each other in the x direction. The paired side surfaces 63 are located on the outer side of the lead frame 3 in the x direction. The paired end surfaces 64 face away from each other in they direction. In the present embodiment, the source terminal 31S, the drain terminal 31D, the gate terminal 31G and the sub-gate terminal 31Gs project from one of the end surfaces 64.

FIG. 21 shows a comparative example of a semiconductor device. The illustrated semiconductor device X includes a transistor 91 and a transistor 92. The transistor 91 is a normally-off transistor, whereas the transistor 92 is a normally-on transistor. The transistor 91 and the transistor 92 are cascode-connected. The drain electrode of the transistor 91 is connected to the source electrode of the transistor 92 via the island 95 and a wire. The gate electrode of the transistor 91 is connected to the gate terminal 94G by a wire. The source electrode of the transistor 91 is connected to the source terminal 94S by a wire. The drain electrode of the transistor 92 is connected to the drain terminal 94D by a wire. The gate electrode of the transistor 92 is connected to the source terminal 94S via a current reduction unit 93. In the semiconductor device X, the source terminal 94S is arranged on a side of the transistor 91 and the transistor 92.

On the other hand, according to the embodiment shown in FIG. 1 and so on, all of the plurality of source wires 41S, the gate wire 41G, the plurality of drain wires 41D and the wire Gs cross one of the second support-part edges 322 of the metal layer 32. The second support-part edge 322 is a part that connects two corresponding ends of a pair of first support-part edges 321. Thus, all of the points of intersection between the edge 320 and the plurality of source wires 41S, the gate wire 41G, the plurality of drain wires 41D and the wire 41Gs are located between the paired first support-part edges 321 in the x direction. This arrangement reduces the necessity for arranging the source terminal 31S, the drain terminal 31D, the gate terminal 31G and the sub-gate terminal 31Gs, which are to be connected to the plurality of source wires 41S, the gate wire 41G, the plurality of drain wires 41D and the wire 41Gs, on a side of the first transistor 1 and the second transistor 2 in the x direction that is supported on the metal layer 32. This leads to size reduction of the semiconductor device A1.

Further, in the present embodiment, all of the plurality of source wires 41S, the gate wire 41G, the plurality of drain wires 41D and the wire Gs cross the edge 120 or the edge 220 between the first element edge part 121 and the first element edge part 221. The first element edge part 121 and the first element edge part 221 are located on the inner side of the paired first support-part edges 321 in the x direction. This also leads to size reduction of the semiconductor device A1.

The metal layer 32 is provided on the island 30 via the insulating layer 33 and insulated from the island 30. Thus, during the operation of the semiconductor device A1, no voltage is applied to the island 30, so that the island 30 is electrically neutral. Thus, exposure of the reverse surface 302 of the island 30 from the reverse surface 62 of the sealing resin 6 does not pose a risk of causing undesirable electric conduction or the like. Moreover, heat generated from the first transistor 1 and the second transistor 2 can be dissipated through the island 30.

The path for the main current inputted or outputted from the source terminal 31S and the drain terminal 31D includes a plurality of source wires 41S and a plurality of drain wires 41D. This allows the main current to flow properly even when the source wires 41S and the drain wires 41D are relatively thin wires made of Au.

The source terminal 31S, the drain terminal 31D, the gate terminal 31G and the sub-gate terminal 31Gs are arranged on one side in the y direction. This leads to size reduction of the semiconductor device A1.

The source terminal 31S, the drain terminal 31D, the gate terminal 31G and the sub-gate terminal 31Gs are arranged adjacent to the first transistor 1 and the second transistor 2 in the y direction. The first source electrode 11S, the second drain electrode 21D, the first gate electrode 11G and the second gate electrode 21G are connected to the source terminal 31S, the drain terminal 31D, the gate terminal 31G and the sub-gate terminal 31Gs only by way of the plurality of source wires 41S, the plurality of drain wires 41D, the gate wire 41G and the wire 41Gs, respectively. Thus, while the semiconductor device X shown in FIG. 24 has a largely bent portion in the conduction path from the transistor 91 to the source terminal 94S, the semiconductor device A1 has no such bent portion. This is suitable for reducing internal resistance and inductance of the semiconductor device A1.

As shown in FIG. 5, the semiconductor device A1 is provided with the sub-gate terminal 31Gs that is electrically connected only to the second gate electrode 21G of the second transistor 2. When the semiconductor device A1 is used as mounted on a circuit board or the like, the response characteristics of the second transistor 2 of the semiconductor device A1 can be adjusted by connecting a resistor element (not shown) to the sub-gate terminal 31Gs.

FIGS. 6-20 show other embodiments of the present disclosure. In these figures, the elements that are identical or similar to those of the foregoing embodiment are designated by the same reference signs as those used for the foregoing embodiment.

Second Embodiment

FIG. 6 is a plan view showing a semiconductor device A2 according to a second embodiment of the present disclosure, and FIG. 7 is a circuit diagram of the semiconductor device A2. In the present embodiment, the semiconductor device A1 includes a resistor element 51. Due to the provision of the resistor element 51, the configuration of the connection of the metal layer 32 or the wires is different from that of the foregoing embodiment. Unlike the foregoing embodiment, the sub-gate terminal 31Gs and the wire 41Gs are not provided. In the present embodiment again, the distance D1 is larger than the distance D3.

In the present embodiment, the metal layer 32 includes a main part 325 and a pair of subparts 326. The first transistor 1 and the second transistor 2 are bonded to the main part 325. The paired subparts 326 are spaced apart from the main part 325, and the resistor element 51 is bonded to the subparts 326. In the illustrated example, the main part 325 has a rectangular cutout portion, in which the paired subparts 326 are located.

The semiconductor device A2 includes a wire 42G and a wire 45S. The wire 42G is connected to the second gate electrode 21G and one of the subparts 326. The wire 45S is connected to the first source electrode 11S and the other one of the subparts 326. With this arrangement, as shown in FIG. 5, the semiconductor device A2 has a conduction path extending from the source terminal 31S to the first source electrode 11S and a conduction path extending from the source terminal 31S to the second gate electrode 21G through the resistor element 51.

As shown in FIG. 6, in the illustrated example, all of the plurality of source wires 41S, the plurality of drain wires 41D and the gate wire 41G cross one of the second support-part edges 322. However, some of the drain wires 41D cross the first element edge part 221 and do not cross the edge 120 or the edge 220 between the first element edge part 121 and the first element edge part 221.

With this configuration again, size reduction of the semiconductor device A2 is achieved. Although some of the drain wires 41D do not cross the edge 120 or the edge 220 between the first element edge part 121 and the first element edge part 221, they still cross the second support-part edge 322, which leads to size reduction of the semiconductor device A2.

The semiconductor device A2 includes the resistor element 51. By appropriately setting the resistance value of the resistor element 51, the response characteristics of the second transistor 2 of the semiconductor device A2 can be adjusted. According to the semiconductor device A2, the necessity of providing a resistor element for adjusting the response characteristics of the second transistor 2 externally is reduced.

Third Embodiment

FIG. 8 is a plan view showing a semiconductor device A3 according to a third embodiment of the present disclosure, and FIG. 9 is a circuit diagram of the semiconductor device A3. In the present embodiment, as shown in FIG. 9, the second transistor 2 incorporates a resistor element 25 (or, the element 2 may be built in the second transistor 2) (not shown in FIG. 8). The resistor element 25 may be located in the conduction path between the second gate electrode 21G and the AlGaN layer 204 of the element body 20. The semiconductor device A3 further includes a wire 43G. The wire 43G is connected to the second gate electrode 21G of the second transistor 2 and the first source electrode 11S of the first transistor 1.

According to this embodiment again, size reduction of the semiconductor device A3 is achieved. As will be understood from FIG. 9, the response characteristics of the second transistor 2 can be adjusted by appropriately setting the resistance value of the resistor element 51. Incorporating the resistor element 25 in the second transistor 2, instead of separately providing the resistor element 51 as is in the foregoing embodiment, is desirable for size reduction of the semiconductor device A3.

Fourth Embodiment

FIG. 10 is a plan view showing a semiconductor device A4 according to a fourth embodiment of the present disclosure. FIG. 11 is a sectional view taken along line XI-XI in FIG. 10, and FIG. 12 is a sectional view taken along line XII-XII in FIG. 10. FIG. 13 is a circuit diagram of the semiconductor device A4.

In the present embodiment, the first transistor 1 is mounted on the second transistor 2. More specifically, the first drain electrode 11D of the first transistor 1 is bonded to the second source electrode 21S of the second transistor 2 by the bonding layer 19. Similarly to the foregoing embodiments, the second transistor 2 is bonded to the metal layer 32 by the bonding layer 29. That is, in the present embodiment, the first transistor 1 is supported on the metal layer 32 via the second transistor 2.

In the present embodiment again, all of the plurality of source wires 41S, the plurality of drain wires 41D and the gate wire 41G cross one of the second support-part edges 322. In the present embodiment, as viewed in the z direction, the first transistor 1 is inside the second transistor 2, so that the edge 120 is located on the inner side of the edge 220. The edge 220 includes a pair of first element edge parts 221. Some of the drain wires 41D cross one of the first element edge parts 221 and do not cross the edge 120 or the edge 220 between the paired first element edge parts 221.

According to this embodiment again, size reduction of the semiconductor device A4 is achieved. In particular, since the first transistor 1 is mounted on the second transistor 2, a large area that allows arrangement of the first transistor 1 and the second transistor 2 side by side as viewed in the z direction is not necessary. This is suitable for size reduction.

Moreover, the first drain electrode 11D and the second source electrode 21S are bonded by the bonding layer 19. This is suitable for reducing the resistance and inductance of the conduction path between the first drain electrode 11D and the second source electrode 21S.

Fifth Embodiment

FIG. 14 is a plan view showing a semiconductor device A5 according to a fifth embodiment of the present disclosure. FIG. 15 is a sectional view taken along line XV-XV in FIG. 14. FIG. 16 is a circuit diagram of the semiconductor device A5.

The semiconductor device A5 includes a plurality of source terminals 31S and a plurality of drain terminal 31D. The plurality of source terminals 31S, a gate terminal 31G and a sub-gate terminal 31Gs are arranged on one side of the metal layer 32 in the y direction, whereas the plurality of drain terminals 31D are arranged on the other side of the metal layer 32 in the y direction. The plurality of source terminals 31S, the gate terminal 31G, the sub-gate terminal 31Gs and the plurality of drain terminals 31D do not project from a pair of end surfaces 64 of the sealing resin 6. Although the plurality of source terminals 31S, the gate terminal 31G, the sub-gate terminal 31Gs and the plurality of drain terminals 31D are exposed from the paired end surfaces 64 while being flush with the end surfaces 64 in the illustrated example, these terminals may not be exposed from the end surfaces 64.

In the semiconductor device A5, the first transistor 1 and the second transistor 2 are arranged as spaced apart in the y direction. A resistor element 51 as well as the first transistor 1 are arranged on one side of the second transistor 2 in the y direction. The second gate electrode 21G and one of the subparts 326 are connected by a wire 42G. The other one of the subparts 326 and the sub-gate terminal 31Gs are connected by a wire 41Gs. Thus, as shown in FIG. 16, the semiconductor device A5 has a circuit configuration in which the resistor element 51 is included in the conduction path between the second gate electrode 21G and the sub-gate terminal 31Gs.

According to this embodiment again, size reduction of the semiconductor device A5 is achieved. Since the plurality of source terminals 31S and the plurality of drain terminal 31D are arranged on the opposite sides in they direction, the circuit board or the like on which the semiconductor device A5 is mounted can secure a large area for each of the portion to be electrically connected to the source terminals 31S and the portion to be electrically connected to the drain terminals 31D, which is suitable for flowing a large current.

Sixth Embodiment

FIG. 17 is a plan view showing a semiconductor device A6 according to a sixth embodiment of the present disclosure. FIG. 18 is a circuit diagram of the semiconductor device A6. The semiconductor device A6 of the present embodiment differs from the semiconductor device A5 in electrical arrangement of the resistor element 51.

The second gate electrode 21G and one of the subparts 326 are connected by a wire 42G. This subpart 326 is connected with the sub-gate terminal 31Gs by a wire 41Gs. The other one of the subparts 326 is connected with the first source electrode 11S by a wire 45S. Thus, as shown in FIG. 18, the semiconductor device A6 has a circuit configuration in which the resistor element 51 is located in the conduction path extending from the first source electrode 11S to the second gate electrode 21G and the sub-gate terminal 31Gs.

According to this embodiment again, size reduction of the semiconductor device A6 is achieved. As will be understood from the present embodiment, the resistor element 51 for adjusting the response characteristics of the second transistor 2 can be advantageously arranged at a desired position in the circuit.

Seventh Embodiment

FIG. 19 is a plan view showing a semiconductor device A7 according to a seventh embodiment of the present disclosure. FIG. 20 is a circuit diagram of the semiconductor device A7.

In the present embodiment, similarly to the above-described semiconductor device A4, the first transistor 1 is mounted on the second transistor 2. More specifically, the first drain electrode 11D of the first transistor 1 is bonded to the second source electrode 21S of the second transistor 2 by the bonding layer 19. As shown in FIG. 20, the second transistor 2 incorporates a resistor element 25. The resistor element 25 is electrically connected to the second gate electrode 21G. As shown in FIG. 19, in the present embodiment, the second gate electrode 21G is connected only to the sub-gate terminal 31Gs by a wire 41Gs. That is, in this circuit configuration, the resistor element 25 is only on the conduction path that extends through the gate terminal 31G and the second gate electrode 21G.

According to this embodiment again, size reduction of the semiconductor device A7 is achieved. As will be understood from the present embodiment, the resistor element 25 for adjusting the response characteristics of the second transistor 2 can be advantageously arranged at a desired position in the circuit.

The semiconductor device according to the present disclosure is not limited to the foregoing embodiments. The specific structure of each part of the semiconductor device according to the present disclosure can be varied in design in many ways.

The present disclosure includes the following clauses:

Clause 1.

A semiconductor device comprising:
a first transistor that includes a first source electrode, a first drain electrode and a first gate electrode;
a second transistor that includes a second source electrode, a second drain electrode and a second gate electrode;
at least one source terminal electrically connected to the first source electrode;
at least one gate terminal electrically connected to the first gate electrode;
at least one drain terminal electrically connected to the second drain electrode;
a source wire electrically connected to the first source electrode, the source wire constituting a conduction path between the first source electrode and one of the at least one source terminal;
a gate wire electrically connected to the first gate electrode, the gate wire constituting a conduction path between the first gate electrode and one of the at least one gate terminal;
a drain wire electrically connected to the second drain electrode, the drain wire constituting a conduction path between the second drain electrode and one of the at least one drain terminal; and
a support part that supports the first transistor and the second transistor;
wherein the support part includes two first support-part edges and two second support-part edges,
each of the two first support-part edges is parallel to a first direction, the two first support-part edges being spaced apart from each other in a second direction that is perpendicular to the first direction,
each of the two second support-part edges is physically connected to the two first support-part edges, and
the source wire, the gate wire and the drain wire cross at least one of the two second support-part edges in plan view.

Clause 2.

The semiconductor device according to clause 1, wherein each of the first transistor and the second transistor is supported on the support part.

Clause 3.

The semiconductor device according to clause 2, wherein the second transistor is located between the first transistor and the support part.

Clause 4.

The semiconductor device according to clause 1, wherein each of the first transistor and the second transistor has an edge including a first element edge part that is parallel to the first direction, the first element edge part of the first transistor and the first element edge part of the second transistor being spaced apart from each other in the second direction,
the first element edge part of the first transistor is located at an outermost position in the second direction among the edge of the first transistor and the edge of the second transistor,
the first element edge part of the second transistor is located at an outermost position in the second direction among the edge of the first transistor and the edge of the second transistor,
each of the source wire, the gate wire and the drain wire includes a point of intersection with one of the edge of the first transistor and the edge of the second transistor, and
the point of intersection of each of the source wire, the gate wire and the drain wire is located between the first element edge part of the first transistor and the first element edge part of the second transistor in the second direction.

Clause 5.

The semiconductor device according to clause 1, wherein the first transistor includes an obverse surface side and a reverse surface that are located opposite to each other in a third direction perpendicular to both of the first direction and the second direction,
the first source electrode and the first gate electrode are located on the obverse surface side of the first transistor, and
the first drain electrode is located on the reverse surface side of the first transistor.

Clause 6.

The semiconductor device according to clause 1, wherein the second transistor includes an obverse surface and a reverse surface that are located opposite to each other in a third direction perpendicular to both of the first direction and the second direction, and
all of the second source electrode, the second drain electrode and the second gate electrode are located on the obverse surface side of the second transistor.

Clause 7.

The semiconductor device according to clause 6, wherein the second transistor includes a layer containing a Group III nitride semiconductor.

Clause 8.

The semiconductor device according to clause 1, wherein the source wire includes a first end bonded to the first source electrode and a second end bonded to one of the at least one source terminal,
the gate wire includes a first end bonded to the first gate electrode and a second end bonded to one of the at least one gate terminal, and
the drain wire includes a first end bonded to the second drain electrode and a second end bonded to one of the at least one drain terminal.

Clause 9.

The semiconductor device according to any one of clauses 1 to 8, further comprising:
an island made of metal; and
an insulating layer laminated on the island,
wherein the support part comprises a metal layer laminated on the insulating layer.

Clause 10.

The semiconductor device according to clause 1, wherein one of the at least one source terminal, one of the at least one drain terminal and one of the at least one gate terminal are located on one side of the support part in the first direction.

Clause 11.

The semiconductor device according to clause 1, wherein one of (a) one of the at least one source terminal, (b) one of the at least one drain terminal and (c) one of the at least one gate terminal is located on a first side of the support part in the first direction, and
another one of (a) one of the at least one source terminal, (b) one of the at least one drain terminal and (c) one of the at least one gate terminal is located on a second side of the support part in the first direction, the second side of the support part in the first direction being opposite in the first direction to the first side of the support part in the first direction.

Clause 12.

The semiconductor device according to clause 11, wherein the at least one drain terminal comprises a plurality of drain terminals, each of the drain terminals being electrically connected to the drain wire.

Clause 13.

The semiconductor device according to clause 11, wherein the at least one source terminal comprises a plurality of source terminals, each of the source terminals being electrically connected to the source wire.

Clause 14.

The semiconductor device according to clause 10, wherein the at least one source terminal comprises a single source terminal, and
the at least one drain terminal comprises a single drain terminal.

Clause 15.

The semiconductor device according to clause 1, wherein the first transistor is normally-off, and the second transistor is normally-on,
the first drain electrode of the first transistor is electrically connected to the second source electrode of the second transistor, and
the semiconductor device further comprises:
a sub-gate terminal electrically connected to the second gate electrode, and
a sealing resin covering each of the first and second transistors, the at least one source terminal, the at least one gate terminal, and the at least one drain terminal.

Clause 16.

The semiconductor device according to clause 15, further comprising a resistor element electrically connected to the sub-gate terminal, the resistor element being separate from the first transistor and the second transistor.

Clause 17.

The semiconductor device according to clause 15, further comprising a resistor element electrically connected to the sub-gate terminal, the resistor element being built in the second transistor.

The invention claimed is:

1. A semiconductor device comprising:
a first transistor that includes a first source electrode, a first drain electrode and a first gate electrode;
a second transistor that includes a second source electrode, a second drain electrode and a second gate electrode;
at least one source terminal electrically connected to the first source electrode;
at least one first gate terminal electrically connected to the first gate electrode;
at least one drain terminal electrically connected to the second drain electrode;
at least one second gate terminal electrically connected to the second gate electrode and provided separately from the at least one source terminal, the at least one first gate terminal and the at least one drain terminal;
a source wire electrically connected to the first source electrode, the source wire constituting a conduction path between the first source electrode and one of the at least one source terminal;
a first gate wire electrically connected to the first gate electrode, the first gate wire constituting a conduction path between the first gate electrode and one of the at least one first gate terminal;
a second gate wire electrically connected to the second gate electrode, the second gate wire constituting a conduction path between the second gate electrode and one of the at least one second gate terminal;
at least one drain wire electrically connected to the second drain electrode, the at least one drain wire constituting a conduction path between the second drain electrode and one of the at least one drain terminal; and
a support part that supports the first transistor and the second transistor;
wherein the support part includes two first support-part edges and two second support-part edges,
each of the two first support-part edges is parallel to a first direction, the two first support-part edges being spaced apart from each other in a second direction that is perpendicular to the first direction,
each of the two second support-part edges is physically connected to the two first support-part edges, and
the source wire, the first gate wire, the second gate wire and the at least one drain wire cross at least one of the two second support-part edges in plan view.

2. The semiconductor device according to claim 1, wherein each of the first transistor and the second transistor is supported on the support part.

3. The semiconductor device according to claim 2, wherein the second transistor is located between the first transistor and the support part.

4. The semiconductor device according to claim 1, wherein each of the first transistor and the second transistor has an edge including a first element edge part that is parallel to the first direction, the first element edge part of the first transistor and the first element edge part of the second transistor being spaced apart from each other in the second direction, the first element edge part of the first transistor is located at an outermost position in the second direction among the edge of the first transistor and the edge of the second transistor, the first element edge part of the second transistor is located at an outermost position in the second direction among the edge of the first transistor and the edge of the second transistor, each of the source wire, the first gate wire and the at least one drain wire includes a point of intersection with one of the edge of the first transistor and the edge of the second transistor, and the point of intersection of each of the source wire, the first gate wire and the at least one drain wire is located between the first element edge part of the first transistor and the first element edge part of the second transistor in the second direction.

5. The semiconductor device according to claim 1, wherein the first transistor includes an obverse surface side and a reverse surface that are located opposite to each other in a third direction perpendicular to both of the first direction and the second direction, the first source electrode and the first gate electrode are located on the obverse surface side of the first transistor, and the first drain electrode is located on the reverse surface side of the first transistor.

6. The semiconductor device according to claim 1, wherein the second transistor includes an obverse surface and a reverse surface that are located opposite to each other in a third direction perpendicular to both of the first direction and the second direction, and all of the second source electrode, the second drain electrode and the second gate electrode are located on the obverse surface side of the second transistor.

7. The semiconductor device according to claim 6, wherein the second transistor includes a layer containing a Group III nitride semiconductor.

8. The semiconductor device according to claim 1, wherein the source wire includes a first end bonded to the first source electrode and a second end bonded to one of the at least one source terminal, the first gate wire includes a first end bonded to the first gate electrode and a second end bonded to one of the at least one first gate terminal, and the at least one drain wire includes a first end bonded to the second drain electrode and a second end bonded to one of the at least one drain terminal.

9. The semiconductor device according to claim 1, further comprising:

an island made of metal; and an insulating layer laminated on the island, wherein the support part comprises a metal layer laminated on the insulating layer.

10. The semiconductor device according to claim 1, wherein one of the at least one source terminal, one of the at least one drain terminal and one of the at least one first gate terminal are located on one side of the support part in the first direction.

11. The semiconductor device according to claim 1, wherein one of (a) one of the at least one source terminal, (b) one of the at least one drain terminal and (c) one of the at least one first gate terminal is located on a first side of the support part in the first direction, and another one of (a) one of the at least one source terminal, (b) one of the at least one drain terminal and (c) one of the at least one first gate terminal is located on a second side of the support part in the first direction, the second side of the support part in the first direction being opposite in the first direction to the first side of the support part in the first direction.

12. The semiconductor device according to claim 11, wherein the at least one drain terminal comprises a plurality of drain terminals, each of the drain terminals being electrically connected to the at least one drain wire.

13. The semiconductor device according to claim 11, wherein the at least one source terminal comprises a plurality of source terminals, each of the source terminals being electrically connected to the source wire.

14. The semiconductor device according to claim 10, wherein the at least one source terminal comprises a single source terminal, and the at least one drain terminal comprises a single drain terminal.

15. The semiconductor device according to claim 1, wherein the first transistor is normally-off, and the second transistor is normally-on, the first drain electrode of the first transistor is electrically connected to the second source electrode of the second transistor, and the semiconductor device further comprises:

a sealing resin covering each of the first and second transistors, the at least one source terminal, the at least one first gate terminal, and the at least one drain terminal.

16. The semiconductor device according to claim 15, further comprising a resistor element electrically connected to the at least one second gate terminal, the resistor element being separate from the first transistor and the second transistor.

17. The semiconductor device according to claim 15, further comprising a resistor element electrically connected to the at least one second gate terminal, the resistor element being built in the second transistor.

18. The semiconductor device according to claim 17, wherein the resistor element is electrically connected to the at least one source terminal.

19. The semiconductor device according to claim 1, wherein the at least one drain wire comprises a plurality of drain wires arranged in a flaring manner as the plurality of drain wires extend from the second drain electrode toward one of the at least one second gate terminal.

20. The semiconductor device according to claim 19, wherein the plurality of drain wires include respective first ends bonded to the second drain electrode and respective second ends bonded to the one of the at least one second gate terminal, wherein the respective first ends of the plurality of drain wires are spaced apart from each other in the first direction, and the respective second ends of the plurality of drain wires are spaced apart from each other in the second direction.

* * * * *